United States Patent
Yu et al.

(10) Patent No.: US 7,319,065 B1
(45) Date of Patent: Jan. 15, 2008

(54) SEMICONDUCTOR COMPONENT AND METHOD OF MANUFACTURE

(75) Inventors: Wen Yu, Fremont, CA (US); Paul Raymond Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 240 days.

(21) Appl. No.: 10/637,406

(22) Filed: Aug. 8, 2003

(51) Int. Cl.
*H01L 21/4763* (2006.01)

(52) U.S. Cl. .................. 438/622; 438/636; 438/643; 438/687

(58) Field of Classification Search ................ 438/622, 438/637, 642–645, 675, 687
See application file for complete search history.

(56) References Cited

U.S. PATENT DOCUMENTS

| | | | |
|---|---|---|---|
| 5,063,175 A | | 11/1991 | Broadbent |
| 5,084,414 A | | 1/1992 | Manley et al. |
| 5,591,673 A | | 1/1997 | Chao et al. |
| 5,683,938 A | | 11/1997 | Kim et al. |
| 5,891,799 A | | 4/1999 | Tsui |
| 6,191,025 B1 | * | 2/2001 | Liu et al. .................. 438/622 |
| 6,277,761 B1 | | 8/2001 | Diewald et al. |
| 6,333,255 B1 | * | 12/2001 | Sekiguchi .................. 438/622 |
| 6,348,408 B1 | * | 2/2002 | Kasai .......................... 438/638 |
| 6,376,292 B1 | * | 4/2002 | Youn et al. ................. 438/197 |
| 6,376,365 B1 | * | 4/2002 | Tsuji .......................... 438/637 |
| 6,417,116 B2 | * | 7/2002 | Kudo et al. ................. 438/780 |
| 6,656,748 B2 | * | 12/2003 | Hall et al. ...................... 438/3 |
| 6,974,768 B1 | * | 12/2005 | Kailasam ..................... 438/625 |

* cited by examiner

*Primary Examiner*—Tuan H. Nguyen
(74) *Attorney, Agent, or Firm*—Farjami & Farjami LLP

(57) ABSTRACT

A semiconductor component having a composite via structure with an enhanced aspect ratio and a method for manufacturing the semiconductor component. Vias having a first aspect ratio are formed in a contact layer disposed on a semiconductor substrate and filled with a metal. The metal is planarized and a dielectric layer is formed over the contact layer. Via extension structures having the same aspect ratio as those in the contact layer are formed in the dielectric layer and aligned with the vias in the contact layer. The vias in the dielectric layer are filled with metal and the metal is planarized. The contact vias in the contact layer and the dielectric layer cooperate to form a composite via structure having the enhanced aspect ratio. Additional dielectric layers having via structures can be included in the composite contact structure to further enhance the aspect ratio of the via structure.

26 Claims, 4 Drawing Sheets

300

SEMICONDUCTOR COMPONENT AND METHOD OF MANUFACTURE

FIELD OF THE INVENTION

This invention relates, in general, to semiconductor components and, more particularly, to metallization systems in semiconductor components.

BACKGROUND OF THE INVENTION

Semiconductor component manufacturers are constantly improving the performance of their components while lowering their cost of manufacture. One way manufacturers have reduced costs has been to increase the device density on a single semiconductor wafer by shrinking the device sizes. Although this increases the number of semiconductor components that can be manufactured from a single semiconductor wafer, it also increases the complexity of the manufacturing processes. For example, the metallization systems used in small geometry semiconductor devices comprise contact openings having high aspect ratios, i.e., the ratio of the height of the contact opening to its width. The contact openings are typically lined with a barrier material prior to being filled with a metal such as tungsten or copper. A drawback of these high aspect ratio contact openings is the difficulty in lining the sidewalls near the bottoms of the contact openings. Because the contact openings are not completely lined with a barrier material, the metal filling them may contact the dielectric material from which the contact openings are made. When the metal is tungsten deposited using tungsten hexafluoride as a precursor, the tungsten hexafluoride corrodes the dielectric material. On the other hand, when the metal is copper, copper atoms are capable of diffusing into the semiconductor device thereby contaminating the semiconductor device and causing it to fail. Another drawback of metallization systems having high aspect ratio contact openings is that they require aggressive Chemical Mechanical Polishing (CMP) techniques in which the CMP slurry comprises a highly reactive component in combination with large abrasive materials. The abrasive materials lodge in the contact openings causing the formation of voids during the metal deposition step. The voids increase the resistance of the metallization system and, if large enough, can create electrical opens in the metallization systems, which in turn result in electrical failure of the semiconductor components.

Accordingly, what is needed is a semiconductor component having high aspect ratio contact openings with sufficient liner coverage to preclude device contamination and a method for manufacturing the semiconductor component that mitigates void formation.

SUMMARY OF THE INVENTION

The present invention satisfies the foregoing need by providing a semiconductor component having a composite via structure and methods for manufacturing the semiconductor component. In accordance with one aspect, the present invention includes a method for manufacturing a semiconductor component in which a first layer of dielectric material having a via filled with a first electrically conductive material is provided, wherein the via has a first aspect ratio. A second layer of dielectric material is formed over the first layer of dielectric material. A first extension via is formed in the second layer of dielectric material, wherein the first extension via has a second aspect ratio, and wherein a trench is absent from the second layer of dielectric material. The first and second vias cooperate to form a composite via having an enhanced aspect ratio. The first extension via is filled with a second electrically conductive material. The first and second electrically conductive materials may be the same. One or both of the electrically conductive materials may comprise multiple layers.

In accordance with another aspect, the present invention comprises a method for manufacturing a metallization system suitable for use in a semiconductor component. A first layer of dielectric material is provided. A first via is formed in the first layer of dielectric material, wherein the first via has a first aspect ratio. The first via is filled with an electrically conductive material. A second layer of dielectric material is formed over the first layer of dielectric material and a via having a second aspect ratio is formed in the second layer of dielectric material. The via in the second layer of dielectric material is filled with an electrically conductive material that may be the same as the electrically conductive material filling the first via. The first via cooperates with the second via to form a composite via having an enhanced aspect ratio, wherein the enhanced aspect ratio is greater than the first and second aspect ratios.

In accordance with yet another aspect, the present invention comprises a metallization system suitable for use in a semiconductor component comprising a first layer of dielectric material having a first via filled with a first electrically conductive material, the first via having a first aspect ratio. A second layer of dielectric material is disposed over the first layer of dielectric material, wherein the second layer of dielectric material includes a second via having a second aspect ratio and filled with a second electrically conductive material. The first via cooperates with the second via to form a composite via having an enhanced aspect ratio that is greater than the first and second aspect ratios. The first and second electrically conductive materials may be the same.

BRIEF DESCRIPTION OF THE DRAWING

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component having high aspect ratio, small dimension, contact openings and a method for manufacturing the semiconductor component. In accordance with an embodiment of the present invention, contact openings having a predetermined aspect ratio, e.g., three to one, are formed in a semiconductor component. The aspect ratio is a ratio of the height of the contact opening to a dimension of the contact opening such as, for example, the width or diameter of the contact opening. The contact openings are subjected to a plasma clean to remove any native oxide that may have formed on the silicide contact regions. Subsequently, the openings are lined with a barrier material and filled with an electrically conductive material such as, for example, titanium or copper. After planarization of the conductive material, a dielectric material is formed over the planarized surface and extension contact openings having a predetermined aspect ratio are formed in the dielectric material. Preferably, the aspect ratios of the extension contact openings are the same as the aspect ratios of the corresponding contact openings. Even more preferably, the widths and aspect ratios of the extension contact openings and the contact openings are substantially the same. The extension contact openings are lined with a barrier material and filled with an electrically conductive material. Then the electrically conductive material is planarized. Because the height of the composite contact structure is increased while the width is maintained at a substantially constant value, the aspect ratio is effectively increased or enhanced. An advantage of the present invention is that the aspect ratio is increased while ensuring adequate coverage by the liner or liner material. In addition, the planarization steps can be carried out using Chemical Mechanical Polishing slurries that are less aggressive than those used for planarization of contact openings having high aspect ratios that are manufactured in a single step.

Figure 1:
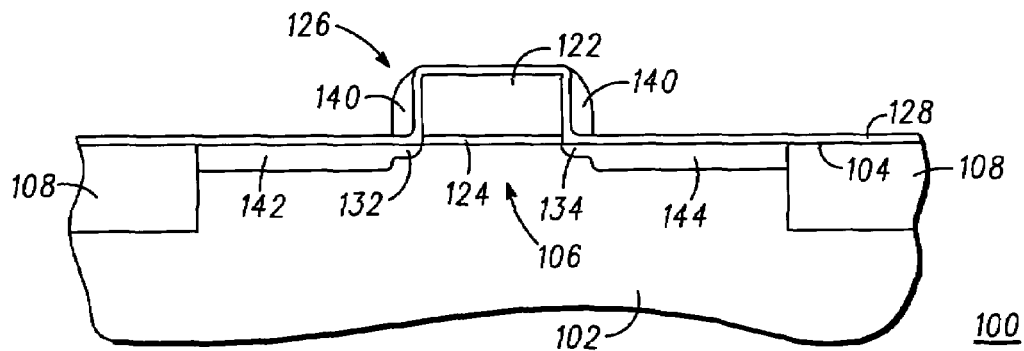
FIG. 1 is an enlarged cross-sectional side view of a portion of a partially completed semiconductor component during manufacture in accordance with an embodiment of the present invention.

FIG. 1 is an enlarged cross-sectional side view of a portion of a partially completed insulated gate field effect transistor 100 during processing in accordance with an embodiment of the present invention. What is shown in FIG. 1 is a semiconductor substrate 102 having a major surface 104 and an active region 106 between isolation structures 108. By way of example, isolation structures 108 are shallow trench isolation structures. Suitable materials for substrate 102 include silicon, silicon germanium, germanium, Silicon-On-Insulator (SOI), or the like. The semiconductor material may also be a semiconductor substrate having an epitaxial layer formed thereon. A gate structure 126, comprising an oxide layer 124 disposed on major surface 104 and a polysilicon layer 122 disposed on oxide layer 124. A conformal layer of dielectric material 128 is deposited on gate structure 126 and the exposed portions of major surface 104. By way of example, the conformal layer of dielectric material 128 is oxide formed by decomposition of silane and has a thickness ranging between approximately 50 Å and 200 Å.

Source and drain extension regions 132 and 134, respectively, are formed in the portion of substrate 102 adjacent gate structure 126. A source region 142 is formed in the portion of substrate 102 between source extension region 132 and an isolation structure 108 and a drain region 144 is formed in the portion of semiconductor substrate 102 between drain extension region 134 and an isolation structure 108. Spacers 140 are formed adjacent the sidewalls of gate structure 126. Techniques for forming source and drain extension regions, source and drain regions, and spacers are known to those skilled in the art.

Figure 2:
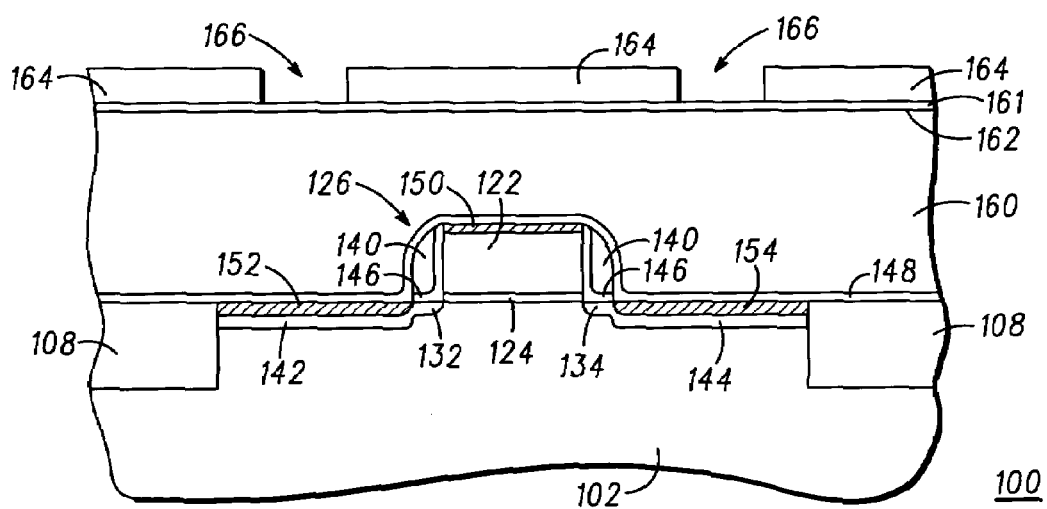
FIG. 2 is an enlarged cross-sectional side view of the semiconductor component of FIG. 1 further along in processing.

Referring now to FIG. 2, oxide layer 128 is anisotropically etched to form spacers 146 and expose a portion of silicon surface 104. A layer of refractory metal (not shown) such as, for example, cobalt, is conformally deposited on the exposed portions of silicon surface 104, spacers 140 and 146, and gate 122. The refractory metal is heated to a temperature ranging between 400° C. and 700° C. The heat treatment causes the cobalt to react with the silicon to form cobalt silicide ($CoSi_2$) in all regions in which the cobalt is in contact with silicon, i.e., cobalt silicide is formed in gate structure 126, source region 142, and drain region 144 to form silicide regions 150, 152, and 154, respectively. By way of example, the thickness of the cobalt silicide ranges between 100 Å and 300 Å. The portions of the cobalt adjacent spacers 140 remains unreacted. The unreacted cobalt is then removed using processes known to those skilled in the art. It should be understood that the type of silicide is not a limitation of the present invention. For example, other suitable silicides include titanium silicide, nickel silicide, platinum silicide, or the like. The silicide forms a portion of the active region of the semiconductor component. More generally, the active regions are those regions having a semiconductor device.

Still referring to FIG. 2, a layer of dielectric material 148 such as, for example, silicon nitride having a thickness ranging between approximately 100 Å and 1,000 Å is formed on silicide regions 150, 152, and 154, spacers 140 and 146, and isolation structures 108. A layer of dielectric material 160 having a major surface 162 is formed on silicon nitride layer 148. By way of example, dielectric material 160 is oxide having a thickness ranging between approximately 2,000 Å and approximately 10,000 Å. A suitable technique for forming layers 148 and 160 is Plasma Enhanced Chemical Vapor Deposition (PECVD). However, the method of forming dielectric layers 148 and 160 is not a limitation of the present invention. It should be understood that dielectric layer 160 may be a single layer of dielectric material or it may be comprised multiple layers of dielectric material such as, for example, a topographic filling layer and a planarization layer. The topographic filling layer is a layer of dielectric material that fills regions between protrusions such as the gate structures that are over a semiconductor substrate. The planarization layer is formed over the topographic filling layer and is made of a lower cost material having a higher dielectric constant than the topographic filling layer. Dielectric layer 160 is planarized using, for example, a Chemical Mechanical Polishing (CMP) technique. As those skilled in the art are aware, Chemical Mechanical Polishing is also referred to as Chemical Mechanical Planarization. Preferably, the planarization process is terminated after a pre-determined amount of time such that the combined thickness of layers 148 and 160 is approximately 7,000 Å.

After planarization, a layer of dielectric material 161 having a thickness ranging between approximately 100 Å and approximately 5,000 Å is formed on dielectric layer 160. Preferably, dielectric layer 161 has a thickness ranging between approximately 300 Å and approximately 1,000 Å and comprises a single layer of a dielectric material such as, for example, silicon oxynitride (SiON), silicon nitride ($Si_xN_y$), silicon rich nitride (SiRN), silicon carbide (SiC), or hydrogenated oxidized silicon carbon material (SiCOH). It should be noted that dielectric layer 161 is not limited to being a single layer system, but can also be a multi-layer system. A layer of photoresist 164 is patterned on dielectric layer 161 to have openings 166 that expose portions of dielectric layer 160. Because dielectric layer 161 lowers the reflection of light during the photolithography steps used in patterning photoresist layer 164, it may also be referred to as an Anti-Reflective Coating (ARC) layer.

Figure 3:
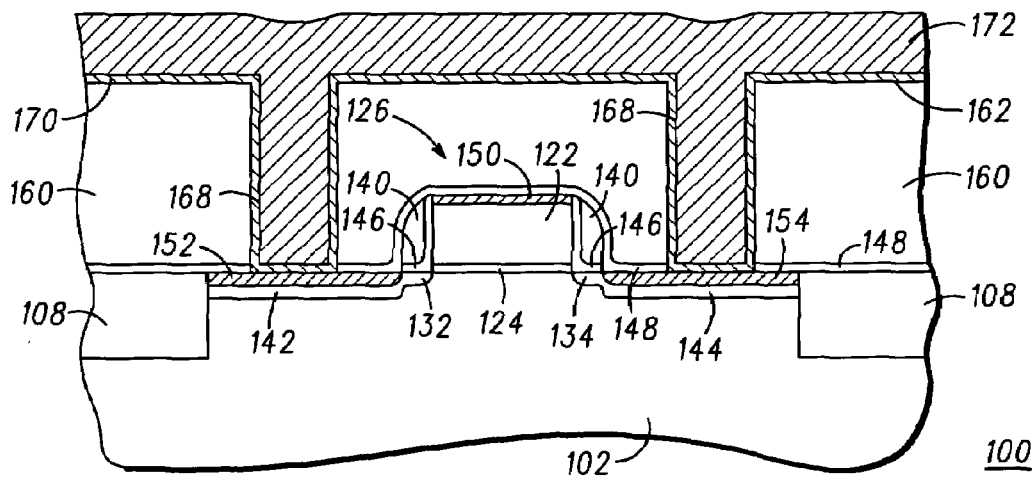
FIG. 3 is an enlarged cross-sectional side view of the semiconductor component of FIG. 2 further along in processing.

Referring now to FIG. 3, the portions of ARC layer 161, oxide layer 160, and nitride layer 148 underlying openings 166 are removed using, for example, a reactive ion etch, to expose portions of silicided regions 152 and 154. In other words, openings are formed in layers 161, 160, and 148 that serve as contact holes which have sidewalls 168. Contact holes are also referred to as contact openings or contact vias. Although not shown, it should be understood that an opening may also be formed to expose silicide region 150 of gate structure 126. Photoresist layer 164 is removed. The openings undergo a plasma clean which preferably comprises an inert gas such as, for example, argon. In addition, a magnetic field may be used with the plasma clean. The argon plasma clean is also referred to as a pre-clean. The argon plasma clean anisotropically etches or removes native oxide that may have formed on silicided regions 152 and 154. Techniques for performing the argon plasma clean are known to those skilled in the art. Optionally, the pre-clean may remove the remaining portions of ARC layer 161 as shown in FIG. 3.

A liner 170 having a thickness ranging between approximately 50 Å and approximately 350 Å is formed on major surface 162, sidewalls 168, and the exposed portions of silicided regions 152 and 154. By way of example, liner 170 is a bilayer structure comprising a titanium contact layer having a titanium nitride layer formed thereon. Suitable techniques for forming liner 170 include Chemical Vapor Deposition (CVD), Plasma Enhanced Chemical Vapor Deposition (PECVD), Atomic Layer Deposition (ALD), or the like. Other suitable materials for liner 170 include tantalum (Ta), titanium nitride (TiN), tantalum nitride (TaN), a tantalum (Ta) and tantalum nitride (TaN) combination, tungsten (W), tungsten nitride (WN), titanium silicon nitride (TiSiN), and refractory metal compounds such as refractory metal nitrides, refractory metal carbides, and refractory metal borides. Although liner 170 is shown as being a conformal layer, it should be understood this is not a limitation of the present invention. In addition, the number of layers for liner 170 is not a limitation of the present invention.

Still referring to FIG. 3, an electrically conductive material 172 having a thickness ranging between approximately 4,000 Å and approximately 8,000 Å is formed on liner 170. By way of example, the electrically conductive material is tungsten. Alternatively, layer 172 may be copper or silver.

Figure 4:
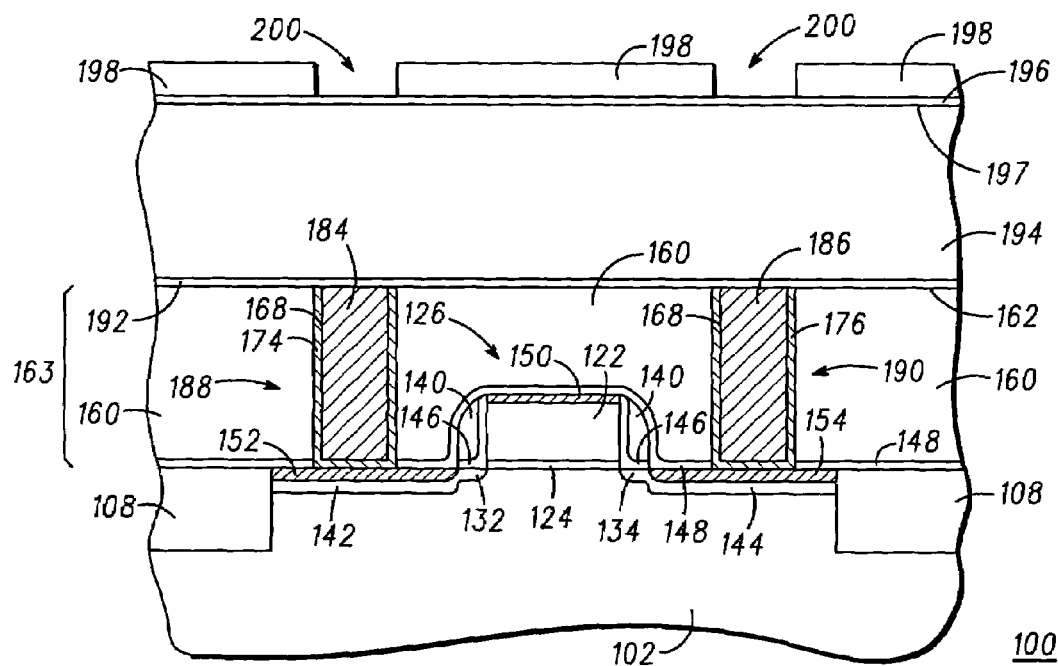
FIG. 4 is an enlarged cross-sectional side view of the semiconductor component of FIG. 3 further along in processing.

Referring now to FIG. 4, electrically conductive material 172 is planarized using, for example, a CMP technique having a high selectivity to dielectric layer 160. Thus, the planarization stops on dielectric layer 160. After planarization, portions 174 and 176 of liner 170 and portions 184 and 186 of conductive material 172 remain in the openings formed in layers 148 and 160. Portions 174 and 184 cooperate to form a source electrical conductor or electrode 188, and portions 176 and 186 cooperate to form a drain electrical conductor or electrode 190. It should be understood that the planarization technique is not a limitation of the present invention. For example, other planarization techniques include electropolishing, electrochemical polishing, chemical polishing, and chemical enhanced planarization. Dielectric layers 148 and 160 and electrodes 188 and 190 cooperate to form a contact layer 163.

A layer of dielectric material 192 such as, for example, silicon nitride having a thickness ranging between approximately 100 Å and 1,000 Å is formed on dielectric layer 160, source electrode 188, and drain electrode 190. A layer of dielectric material 194 having a major surface 197 is formed on silicon nitride layer 192. By way of example, dielectric layer 194 is oxide having a thickness ranging between approximately 2,000 Å and 10,000 Å. A suitable technique for forming layers 192 and 194 is PECVD. However, the method for forming dielectric layers 192 and 194 is not a limitation of the present invention.

An ARC layer 196, similar to ARC layer 161, is formed on dielectric layer 194 and a layer of photoresist 198, similar to photoresist layer 164, is formed on ARC layer 196. Photoresist layer 198 is patterned to form openings 200.

Figure 5:
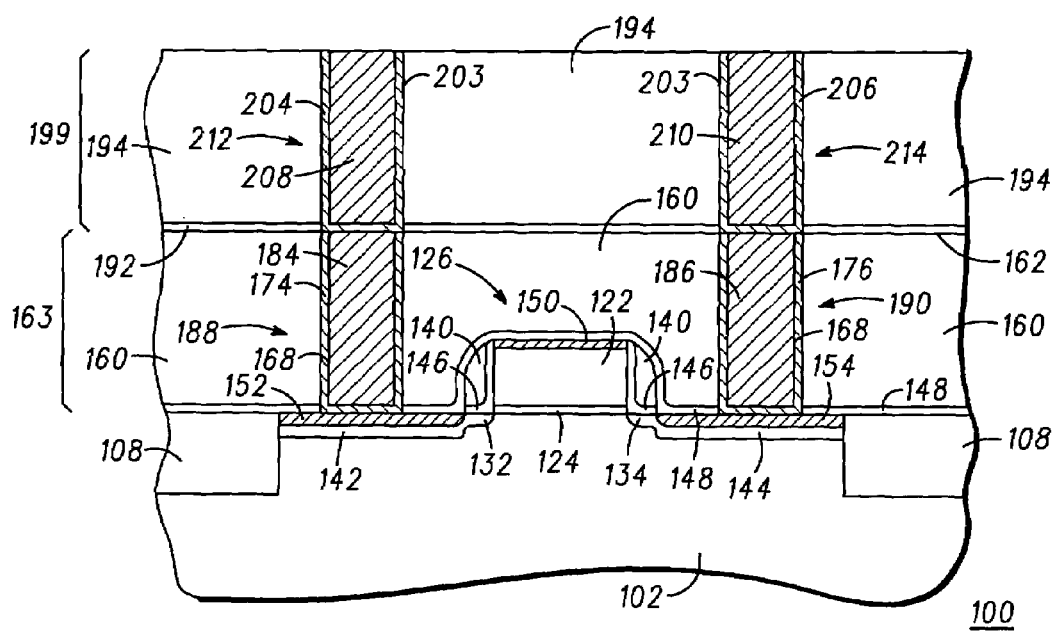
FIG. 5 is an enlarged cross-sectional side view of the semiconductor component of FIG. 4 further along in processing.

Referring now to FIG. 5, the portions of ARC layer 196, oxide layer 194, and silicon nitride layer 192 underlying openings 200 are anisotropically etched using a reactive ion etch to form via extensions having sidewalls 203, wherein the via extensions expose source and drain electrodes 188 and 190, respectively. The via extensions are also referred to as extension vias or extension openings. Although not shown, it should be understood that via extensions can be formed that expose silicide region 150 of gate structure 126. The via extensions undergo a pre-clean which removes native oxide that may have formed on electrodes 188 and 190. Techniques for performing the pre-clean are described with reference to FIG. 3. In addition, the pre-clean removes the remaining portions of ARC layer 196.

Still referring to FIG. 5, a liner (not shown) similar to liner 170 is formed on dielectric material 194, source electrode 188, drain electrode 190, and sidewalls 203. The liner may be formed using the same techniques as those used for forming liner 170 as described with reference to FIG. 4. An electrically conductive material (not shown) similar to electrically conductive material 172 is formed on the liner. Techniques for forming the electrically conductive material may be the same as those described for forming electrically conductive material 172.

The electrically conductive material is planarized using, for example, a CMP technique having a high selectivity to dielectric layer 194. Thus, the planarization stops on dielectric layer 194. After planarization, portions 204 and 206 of the liner and portions 208 and 210 of the conductive material remain in the openings formed in layers 192 and 194. Portions 204 and 208 cooperate to form an extension 212 of source electrode 188, and portions 206 and 210 cooperate to form an extension 214 of drain electrode 190. It should be understood the planarization technique is not a limitation of the present invention. For example, other suitable planarization techniques include electropolishing, electrochemical polishing, chemical polishing, and chemical enhanced planarization. Dielectric layers 192 and 194 and extensions 212 and 214 cooperate to form a contact layer 199.

Figure 6:
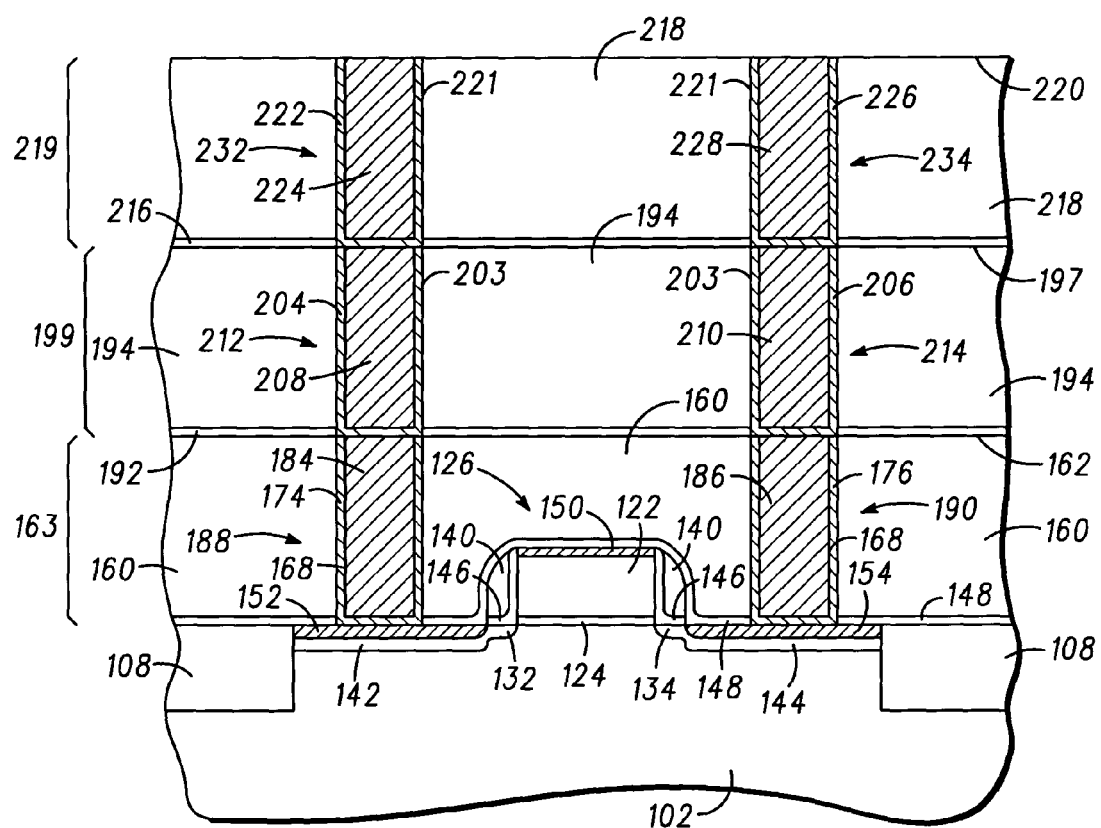
FIG. 6 is an enlarged cross-sectional side view of the semiconductor component of FIG. 5 further along in processing.

Referring now to FIG. 6, a layer of dielectric material 216 such as, for example, silicon nitride having a thickness ranging between approximately 100 Å and 1,000 Å is formed on dielectric layer 194, source contact extension 212, and drain contact extension 214. A layer of dielectric material 218 having a major surface 220 is formed on silicon nitride layer 216. By way of example, dielectric material 218 is oxide having a thickness ranging between approximately 2,000 Å and approximately 10,000 Å. A suitable technique for forming layers 216 and 218 is PECVD. However, the method for forming dielectric layers 216 and 218 is not a limitation of the present invention.

An ARC layer (not shown), similar to ARC layer 161, is formed on dielectric layer 218 and a layer of photoresist (not shown), similar to photoresist layer 164, is patterned on the ARC layer. The ARC layer, dielectric layer 218, and silicon nitride layer 216 are anisotropically etched using a reactive ion etch to form via extensions having sidewalls 221. The via extensions are also referred to as extension vias, extension openings, or openings. Preferably, the extension vias are positioned such that they are aligned to and expose source electrode extension 212 and drain electrode extension 214.

The extension vias undergo a pre-clean which removes native oxide that may have formed on source and drain electrode extensions 212 and 214, respectively. Techniques for performing the pre-clean are described with reference to FIG. 3. In addition, the pre-clean removes the remaining portions of the ARC layer.

A liner (not shown) similar to liner 170 is formed on dielectric material 218, source electrode extension 212, drain electrode extension 214, and sidewalls 221. The liner may be formed using the same techniques as those used for forming liner 170 as described with reference to FIG. 4. An electrically conductive material (not shown) similar to electrically conductive material 172 is formed on the liner. Techniques for forming the electrically conductive material may be the same as those described for forming electrically conductive material 172.

The electrically conductive material is planarized using, for example, a CMP technique having a high selectivity to dielectric layer 218. Thus, the planarization stops on dielectric layer 218. After planarization, portions 222 and 226 of the liner and portions 224 and 228 of the conductive material remain in the openings formed in layers 216 and 218. Portions 222 and 224 cooperate to form a further extension 232 of electrode 188, and portions 226 and 228 cooperate to form a further extension 234 of drain electrode 190. Extension 232 is coupled to source electrode 188 through source electrode extension 212 and extension 234 is coupled to drain electrode 190 through drain electrode extension 214. It should be understood the planarization technique is not a limitation of the present invention. For example, other suitable planarization techniques include electropolishing, electrochemical polishing, chemical polishing, and chemical enhanced planarization. Dielectric layers 216 and 218 and extensions 232 and 234 cooperate to form a contact layer 219.

In accordance with the embodiments shown and described with reference to FIGS. 1-8, layers 163, 199, and 219 cooperate to form a metallization system comprising a composite via structure having an enhanced aspect ratio. By way of example, the aspect ratios and the widths of each via in the layers that make up the metallization system may be made to be three-to-one (3 to 1). Thus, the aspect ratio of the composite via structures shown in FIG. 6 is nine-to-one (9 to 1). It should be understood that the particular value of the aspect ratio is not a limitation of the present invention. For example, the enhanced aspect ratio of the enhanced via may be manufactured to be more or less than nine-to-one. Moreover, the aspect ratio of a via structure in one layer of a composite via structure may be different from the aspect ratio of a via structure in an overlying layer of the composite via structure. Thus, the ratio of the height of the contact opening to the dimension, e.g., width, of a contact opening in one layer can be different than the ratio of the height of the contact opening to the dimension, e.g., width, of an overlying layer. In accordance with one embodiment, the width of the underlying contact opening can be greater than or less than the width of the overlying contact opening.

Figure 7:
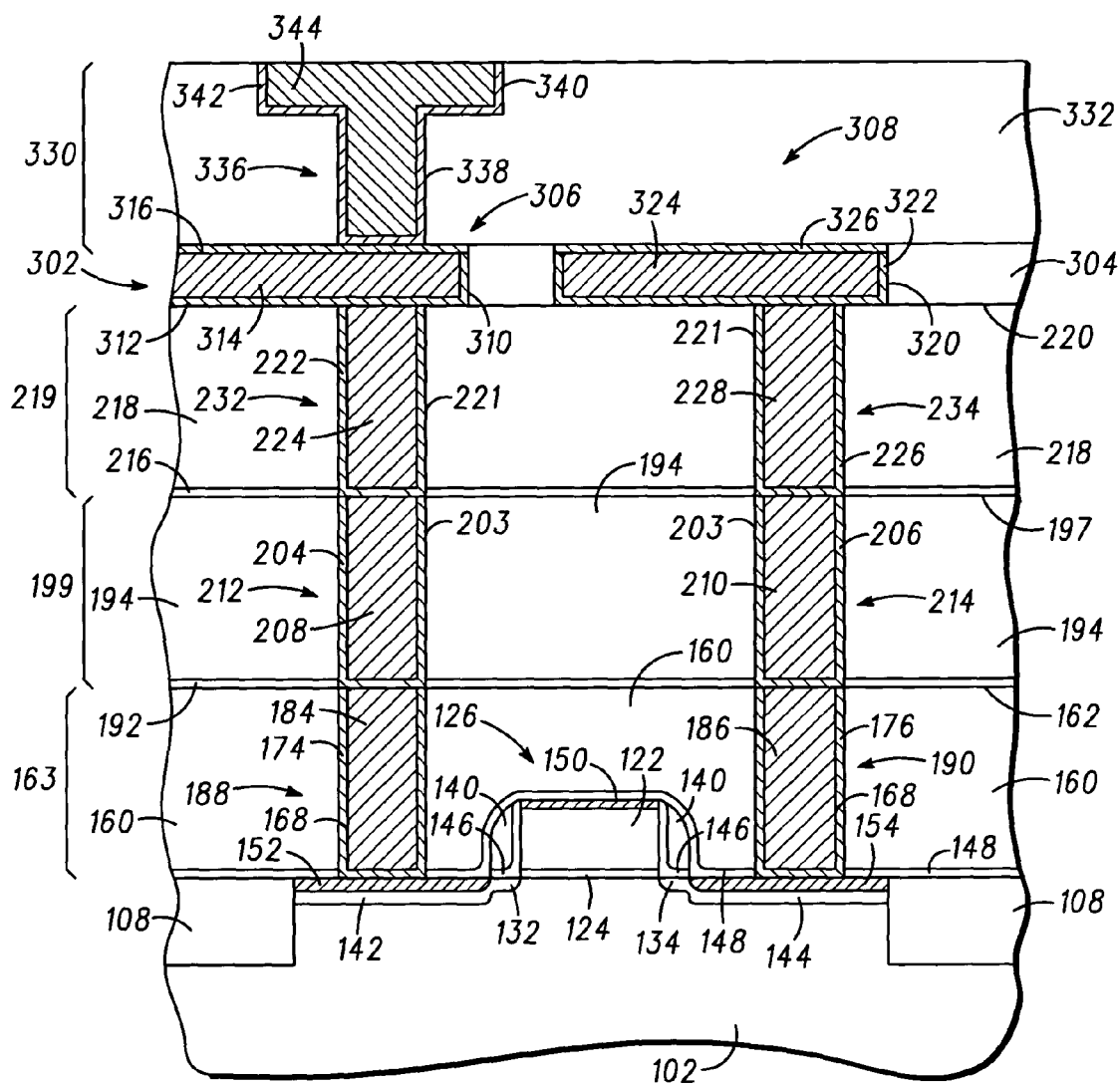
FIG. 7 is an enlarged cross-sectional side view of a semiconductor component in accordance with another embodiment of the present invention.

Referring now to FIG. 7, an enlarged cross-sectional side view of a semiconductor component 300 in accordance with another embodiment of the present invention is illustrated. It should be understood that that the beginning processing steps for manufacturing semiconductor component 300 can be the same as those for semiconductor component 100. Accordingly, the description of FIG. 7 continues from FIG. 6. An interconnect layer 302 is formed on dielectric layer 218. Interconnect layer 302 comprises a dielectric layer 304 having metal interconnects 306 and 308 formed therein. By way of example, interconnect layer 302 is formed using a single damascene process. Thus, interconnect 306 comprises a trench 310 lined with a layer of material 312 such as, for example, titanium, tantalum, tantalum nitride, or tungsten nitride. The lined trench is filled with copper metal 314, and a barrier layer 316 is formed on copper metal 314. Likewise, a trench 320 is lined with a layer of titanium or tantalum 322 and filled with copper metal 324. A barrier layer 326 is formed over copper metal 324. Interconnect 306 transmits electrical signals to and from source region 142 and interconnect 308 transmits electrical signals to and from drain region 144. Although layers 219 and 302 have been shown and described as being formed as two separate layers, it should be understood that layers 219 and 302 can be formed together using a dual damascene process.

A metallization structure 330 is formed on interconnect layer 302. Metallization structure 330 comprises a dielectric layer 332 having a metal interconnect 336 formed therein. By way of example, metallization structure 330 is formed using a dual damascene process. Thus, interconnect 336 of metallization structure 330 comprises a via 338 and a trench 340 lined with a barrier layer 342. The barrier lined via and trench are filled with copper metal 344. Interconnect 336 transmits electrical signals laterally in semiconductor component 300. An advantage of the embodiment shown in FIG. 7 is that electrodes 188, 212, and 232 serve as extensions between interconnect layer 302 and source region 142. This allows a cost effective means for forming a planar surface on which interconnect layer 302 can be formed. This is particularly beneficial in multi-level metallization systems formed over semiconductor substrates having nonplanar topography.

By now it should be appreciated that a semiconductor component and a method for manufacturing the semiconductor component have been provided. In accordance with the present invention, the aspect ratio of the contact openings can be tailored to be a specified value. For example, the aspect ratio can be three-to-one, four-to-one, five-to-one, etc. Another advantage of the present invention is that it provides a means for manufacturing semiconductor components having contact openings with high aspect ratios that is readily integrable into manufacturing process flows using existing tool sets. The method increases the yields of the semiconductor components without costly process changes. In addition, the planarization steps can be carried out using lower cost, less aggressive CMP slurries. Because the slurries are less aggressive, abrasive particles from the slurries do not become lodged in the contact openings; therefore, voids are not formed and the resistance of the metallization system is not increased. Moreover, the amount of time to planarize the oxide layers is decreased which decreases the volume and cost of CMP slurries.

Although certain preferred embodiments and methods have been disclosed herein, it will be apparent from the foregoing disclosure to those skilled in the art that variations and modifications of such embodiments and methods may be made without departing from the spirit and scope of the invention. For example, the dielectric material through which the contact openings are manufactured may be either low dielectric constant or high dielectric constant dielectric material. It is intended that the invention shall be limited only to the extent required by the appended claims and the rules and principles of applicable law.

What is claimed is:

1. A method for manufacturing a semiconductor component, comprising:
   providing a first layer of dielectric material;
      forming an anti-reflective coating layer on the first layer of dielectric material;
      forming a via in the anti-reflective coating layer and the first layer of dielectric material, the via having a first aspect ratio;
      removing a remaining portion of the anti-reflective coating layer;
      filling the via with a first electrically conductive material;
      forming a second layer of dielectric material over the first layer of dielectric material;
      forming a first extension via in the second layer of dielectric material, the first extension via having a second aspect ratio, wherein a trench is absent from the second layer of dielectric material;
      performing a pre-clean process on said first extension via;
      filling the first extension via with a second electrically conductive material.

2. The method of claim 1, wherein the first aspect ratio is the same as the second aspect ratio, and wherein the first aspect ratio cooperates with the second aspect ratio to form an increased aspect ratio that is greater than the first and second aspect ratios individually.

3. The method of claim 2, further including forming the first and second aspect ratios to be three-to-one, wherein the increased aspect ratio is six-to-one.

4. The method of claim 1, further including aligning the first extension via to the via.

5. The method of claim 1, wherein the first electrically conductive material is the same as the second electrically conductive material.

6. The method of claim 1, wherein filling the extension via includes:
   lining the first extension via with a barrier material; and
   forming copper over the barrier material, wherein the copper fills the first extension via.

7. The method of claim 6, wherein the barrier material is a material selected from the group of materials consisting of titanium, titanium nitride, tantalum, tantalum nitride, a tantalum and tantalum nitride combination, tungsten, tungsten nitride, titanium silicon nitride, refractory metal compounds, refractory metal carbides, and refractory metal borides.

8. The method of claim 7, wherein providing the first layer of dielectric material includes:
   lining the via with a metal selected from the group of metals consisting of titanium, titanium nitride, tantalum, tantalum nitride, a tantalum and tantalum nitride combination, tungsten, tungsten nitride, titanium silicon nitride, refractory metal compounds, refractory metal carbides, and refractory metal borides; and
   disposing a metal in the lined via, the metal selected from the group of metals consisting of tungsten, titanium, tantalum, copper, silver, and aluminum; wherein the metal lining the via and the metal disposed in the via cooperate to form the first electrically conductive material.

9. The method of claim 1, wherein providing the first layer of dielectric material includes coupling the electrically conductive material filling the via to a semiconductor device.

10. The method of claim 1, further including:
    forming a third layer of dielectric material;
    forming a second extension via in the third layer of dielectric material, the second extension via having a third aspect ratio; and
    filling the second extension via with a third electrically conductive material.

11. The method of claim 10, wherein filling the second extension via includes:
    lining the second extension via with a barrier material; and
    forming metal over the barrier material, wherein the metal fills the second extension via.

12. The method of claim 11, wherein the metal is copper.

13. The method of claim 10, wherein the first, second, and third aspect ratios are the same value, and wherein the first, second, and third aspect ratios cooperate to form an increased aspect ratio that is greater than the first, second, and third aspect ratios individually.

14. The method of claim 13, further including:
    forming a fourth layer of dielectric material over the third layer of dielectric material;
    forming a trench in the fourth layer of dielectric material; and
    filling the trench with a third electrically conductive material.

15. The method of claim 14, wherein filling the trench with the third electrically conductive material includes lining the trench with a barrier layer and disposing copper over the barrier layer.

16. The method of claim 10, wherein the via is a contact via.

17. A method for manufacturing a metallization system suitable for use in a semiconductor component, comprising:
    providing a first layer of dielectric material;
    forming an anti-reflective coating layer on the first layer of dielectric material;
    forming a first via in the first layer of dielectric material and the anti-reflective coating layer, the first via having a first aspect ratio;
    performing a first pre-clean process on said first via, wherein the first pre-clean process removes a remaining portion of the anti-reflective coating layer;
    filling the first via with a first electrically conductive material;
    forming a second layer of dielectric material over the first layer of dielectric material;
    forming a second via in the second layer of dielectric material, the second via having a second aspect ratio, wherein the first via cooperates with the second via to form a composite via having an enhanced aspect ratio, the enhanced aspect ratio greater than the first and second aspect ratios;
    performing a second pre-clean process on said second via;
    filling the second via with a second electrically conductive material.

18. The method of claim 17, further including:
    forming a third layer of dielectric material over the second layer of dielectric material;
    forming a third via in the third layer of dielectric material, the third via having a third aspect ratio, wherein the first, second, and third vias cooperate to form the composite via having the enhanced aspect ratio, and wherein the enhanced aspect ratio is greater than the third aspect ratio; and
    filling the third via with a third electrically conductive material.

19. The method of claim 18, wherein filling the first via comprises lining the first via with a first barrier layer and disposing a first metal over the first barrier layer.

20. The method of claim 19, wherein filling the second via comprises lining the second via with a second barrier layer and disposing second metal over the second barrier layer.

21. The method of claim 20, wherein the first metal is one of titanium and tungsten and the second metal is copper.

22. The method of claim 18, wherein filling the third via includes planarizing the third electrically conductive material.

23. The method of claim 22, further including planarizing using chemical mechanical planarization.

24. The method of claim 23, wherein the first, second, and third vias are aligned and the first, second, and third aspect ratios are substantially the same.

25. The method of claim 17, wherein filling the first via includes planarizing the first electrically conductive material and filling the second via includes planarizing the second electrically conductive material.

26. The method of claim 17, wherein the first and second vias are aligned and the first and second aspect ratios are substantially the same.

* * * * *